United States Patent
Ok et al.

(10) Patent No.: US 9,673,101 B2
(45) Date of Patent: Jun. 6, 2017

(54) MINIMIZE MIDDLE-OF-LINE CONTACT LINE SHORTS

(71) Applicant: International Business Machines Corporation, Armonk, NY (US)

(72) Inventors: Injo Ok, Loudonville, NY (US); Balasubramanian Pranatharthiharan, Watervliet, NY (US); Soon-Cheon Seo, Glenmont, NY (US); Charan V. Surisetty, Clifton Park, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/870,534

(22) Filed: Sep. 30, 2015

(65) Prior Publication Data
US 2017/0092543 A1 Mar. 30, 2017

(51) Int. Cl.
*H01L 21/3205* (2006.01)
*H01L 21/4763* (2006.01)
*H01L 21/8234* (2006.01)
*H01L 29/66* (2006.01)
*H01L 21/768* (2006.01)
*H01L 21/3213* (2006.01)
*H01L 21/31* (2006.01)
*H01L 21/311* (2006.01)
*H01L 29/423* (2006.01)
(Continued)

(52) U.S. Cl.
CPC ...... *H01L 21/823475* (2013.01); *H01L 21/31* (2013.01); *H01L 21/31111* (2013.01); *H01L 21/32133* (2013.01); *H01L 21/76802* (2013.01); *H01L 21/76829* (2013.01); *H01L 21/76879* (2013.01); *H01L 21/823437* (2013.01); *H01L 27/088* (2013.01); *H01L 29/42356* (2013.01); *H01L 29/66477* (2013.01); *H01L 29/78* (2013.01)

(58) Field of Classification Search
USPC .... 438/586, 587, 299; 257/E21.19, E21.626, 257/E21.64
See application file for complete search history.

(56) References Cited

U.S. PATENT DOCUMENTS

| | | | | |
|---|---|---|---|---|
| 8,048,790 B2* | 11/2011 | Soss | ............... | H01L 21/28114 438/585 |
| 8,436,404 B2* | 5/2013 | Bohr | ............... | H01L 21/76831 257/288 |

(Continued)

*Primary Examiner* — Telly Green
(74) *Attorney, Agent, or Firm* — Scully, Scott, Murphy & Presser, P.C.; Steven J. Meyers, Esq.

(57) ABSTRACT

Semiconductor structures and methods of forming such structures are disclosed. In an embodiment, the semiconductor structure comprises a substrate, a dielectric layer, and a plurality of gates, including a first gate and a pair of adjacent gates. The method comprises forming gate caps on the adjacent gates, including etching portions of the gate electrodes in the adjacent gates to recess the gate electrodes therein, and forming the caps above the recessed gate electrodes. Conductive metal trenches are formed in the dielectric layer, on the sides of the first gate; and after forming the trenches, a contact is formed over the gate electrode of the first gate and over and on one of the conductive trenches. In embodiments, the contact is a gate contact, and in other embodiments, the contact is a non-gate contact.

17 Claims, 13 Drawing Sheets

(51) Int. Cl.
*H01L 29/78* (2006.01)
*H01L 27/088* (2006.01)

(56) References Cited

U.S. PATENT DOCUMENTS

| | | | |
|---|---|---|---|
| 8,741,718 B2* | 6/2014 | Sardesai | H01L 21/823425 257/368 |
| 8,836,040 B2 | 9/2014 | Kamal et al. | |
| 8,993,389 B2* | 3/2015 | Greene | H01L 21/28 438/183 |
| 9,054,178 B2* | 6/2015 | Bohr | H01L 21/76831 |
| 9,093,513 B2* | 7/2015 | Bohr | H01L 21/76831 |
| 2009/0218693 A1* | 9/2009 | Lee | H01L 21/76843 257/751 |
| 2011/0062501 A1* | 3/2011 | Soss | H01L 21/28114 257/288 |
| 2011/0156107 A1* | 6/2011 | Bohr | H01L 21/76831 257/288 |
| 2011/0198670 A1 | 8/2011 | Ramani et al. | |
| 2011/0281426 A1* | 11/2011 | Kim | H01L 21/76804 438/586 |
| 2013/0178033 A1* | 7/2013 | Bohr | H01L 21/76831 438/299 |
| 2013/0234335 A1 | 9/2013 | Fitz et al. | |
| 2013/0256809 A1 | 10/2013 | Liu et al. | |
| 2013/0330923 A1 | 12/2013 | Lin et al. | |
| 2014/0001563 A1 | 1/2014 | Rashed et al. | |
| 2014/0077276 A1 | 3/2014 | Anderson et al. | |
| 2014/0138793 A1 | 5/2014 | Chidambaram et al. | |
| 2014/0151817 A1* | 6/2014 | Bohr | H01L 21/76831 257/410 |
| 2014/0353728 A1 | 12/2014 | Derderian | |
| 2015/0028431 A1 | 1/2015 | Baars et al. | |
| 2015/0108577 A1 | 4/2015 | Cai et al. | |
| 2015/0179576 A1 | 6/2015 | Naczas et al. | |
| 2015/0270216 A1* | 9/2015 | Bohr | H01L 21/76831 257/401 |
| 2016/0155815 A1* | 6/2016 | Bohr | H01L 21/76831 257/410 |

* cited by examiner

REMOVE MASK, DEPOSIT SiN CAP MATERIAL,
SiN CMP STOP ON METALS/OXIDE

TS-ETCH, METAL DEPOSITION AND CMP

POST W-GATE CMP

MINIMIZE MIDDLE-OF-LINE CONTACT LINE SHORTS

BACKGROUND

This invention generally relates to semiconductor structures, and more specifically, to preventing trench silicide shorts in semiconductor structures.

In the formation of semiconductor devices, it is beneficial to provide both desired electrical contact between certain regions of the devices formed and also to prevent contact between various other regions of the devices formed in the substrate. As the technology advances, allowing for the formation of smaller and smaller devices, it is increasingly difficult to achieve the desired electrical contacts while also preventing undesired electrical shorts from developing.

For instance, in some semiconductor structures, conductive line-type device level contacts are formed between gates. These device level contacts are referred to as trench silicide regions or trench silicides. Insulating spacers are used to separate the trench silicides from the gates. However, as the gate caps are etched, portions of these insulating spacers may also be etched away. Subsequently, when metal is deposited on the gate, metal may fill some of the space previously filled by the etched away spacer and form an undesired electrical contact, or short, between the trench silicide and the gate. The above-described processing is performed in the middle of the procedure used to fabricate the semiconductor structure, and thus the above-discussed shorts are referred to as middle-of-line contact shorts.

SUMMARY

Embodiments of the invention provide semiconductor structures and methods of forming such structures.

In an embodiment, the semiconductor structure comprises a semiconductor substrate, a dielectric layer on the substrate, and a plurality of gates located within the dielectric layer, above the substrate, the plurality of gates including a first gate and a pair of adjacent gates on sides of the first gate, and each of the gates including a gate electrode. The method comprises forming gate caps on the pair of adjacent gates, including etching portions of the gate electrodes in said adjacent gates to recess the gate electrodes therein, and forming the caps on said adjacent gates above the recessed gate electrodes; and masking the first gate during the etching. The method further comprises forming conductive metal trenches in the dielectric layer and on the sides of the first gate, between the first gate and the adjacent gates, each of the metal trenches being spaced from and electrically separated from the first gate; and after forming the conductive metal trenches, forming a contact over and on the gate electrode of the first gate and one of the conductive trenches to connect electrically the first gate and said one of the conductive metal trenches.

In an embodiment, the forming the contact includes depositing a metal material over and into contact with the first gate and said one of the metal trenches to form the contact in electrical contact with the first gate and said one of the metal trenches while keeping the gate electrically separated from a second of the conductive metal trenches.

In embodiments, the forming the contact further includes forming an insulating layer over the series of gates and the conductive metal trenches, and removing a portion of the insulating layer to form an open area over and extending to the gate electrode of the first gate and the one of the conductive metal trenches; and the depositing a metal material includes depositing a metal fill in said open area to form the contact.

In one embodiment, the removing a portion of the insulating layer includes maintaining the insulating layer over the second of the conductive metal trenches; and the depositing a metal fill includes using the insulating layer to keep the metal fill separated from the second of the conductive metal trenches to keep the first gate electrically separated from the second of the conductive metal trenches.

In embodiments, the forming the contact includes depositing a conductive material above and on the first gate and the conductive metal trenches; and etching away a portion of the conductive material from a second of the conductive metal trenches to form the contact in electrical contact with the first gate and said one of the metal trenches while keeping the first gate electrically separated from the second of the conductive metal trenches.

In embodiments, the contact is a gate-contact; the semiconductor structure defines a top plane; the dielectric layer and the plurality of gates extend downward from said top plane; the etching portions of the gate electrodes in the adjacent gates includes etching the gate electrodes in the adjacent gates inward from said top plane; and the forming conductive metal trenches in the dielectric layer includes forming the conductive metal trenches after the caps are formed on the adjacent gates, and forming the conductive metal trenches inward from said top plane.

In an embodiment, the method comprises forming gate caps on the pair of adjacent gates; and after forming the gate caps, forming conductive metal trenches in the dielectric layer and on the sides of the first gate, between the first gate and the adjacent gates, each of the metal trenches being spaced from and electrically separated from the first gate. The method further comprises, after forming the conductive metal trenches, forming a contact over the gate electrode of the first gate and over and on one of the conductive trenches to connect the contact electrically with said one of the conductive metal trenches.

In embodiments, the forming the contact includes depositing a metal material over the first gate and over and onto said one of the metal trenches to form the contact in electrical contact with said one of the metal trenches while keeping the first gate electrically separated from a second of the conductive metal trenches.

In an embodiment, the forming the contact further includes forming an insulating layer over the plurality of gates and the conductive metal trenches, and removing a portion of the insulating layer to form an open area over the gate electrode of the first gate and over and extending to the one of the conductive metal trenches; and the depositing a metal material includes depositing a metal fill in said open area to form the contact.

In an embodiment, the depositing the metal fill includes maintaining the metal fill separated from the gate electrode of the first gate to keep the first gate electrically separated from the contact and the one of the conductive metal trenches.

In embodiments, the forming a contact includes depositing a conductive material above the first gate and above and on the conductive metal trenches; and etching away a portion of the conductive material from a second of the conductive metal trenches to form the contact in electrical contact with said one of the metal trenches while keeping the first gate electrically separated from the conductive metal trenches.

In embodiments, the contact is a non-gate contact; and the forming a contact further includes forming an insulating layer over said second of the conductive metal trenches to keep the contact and said one of the conductive metal trenches electrically separated from said second of the conductive metal trenches.

Embodiments of the invention provide a semiconductor structure comprising a semiconductor substrate; a dielectric layer on the substrate; and a plurality of gates located within the dielectric layer, above the substrate, the plurality of gates including a first gate and a pair of adjacent gates on sides of the first gate, each of the gates including a gate electrode, and each of the adjacent gates including a gate cap. A pair of conductive metal trenches are formed in the dielectric layer, on the sides of the center gate, between the center gate and the adjacent gates; and a gate contact is positioned over and on the gate electrode of the first gate and one of the conductive trenches to connect electrically the first gate and said one of the conductive metal trenches.

In embodiments, the contact includes a metal material deposited over and into contact with the first gate and said one of the metal trenches to form the contact in electrical contact with the first gate and said one of the metal trenches while keeping the first gate electrically separated from a second of the conductive metal trenches.

In embodiments, the semiconductor structure further comprises an insulating layer over the second of the conductive metal trenches to keep the first gate electrically separated from the second of the conductive metal trenches.

In an embodiment, the insulating layer electrically separates the contact from the second of the conductive metal trenches.

Embodiments of the invention provide a semiconductor structure comprising a semiconductor substrate; a dielectric layer on the substrate; and a plurality of gates located within the dielectric layer, above the substrate, the plurality of gates including a first gate and a pair of adjacent gates on sides of the first gate, each of the gates including a gate electrode, and each of the adjacent gates including a gate cap. A pair of conductive metal trenches are formed in the dielectric layer, on the sides of the center gate, between the center gate and the adjacent gates; and a non-gate contact is positioned over the gate electrode of the first gate and over and on one of the conductive trenches to connect the contact electrically with said one of the conductive metal trenches.

In embodiments, the contact includes a metal material deposited over the first gate and over and onto said one of the metal trenches to form the contact in electrical contact with said one of the metal trenches while keeping the first gate electrically separated from a second of the conductive metal trenches.

In embodiments the metal fill is maintained separated from the gate electrode of the first gate to keep the first gate electrically separated from the contact and from the conductive metal trenches.

In an embodiment, the first gate includes a gate cap separating the gate electrode of the first gate from the contact.

DETAILED DESCRIPTION

The detailed description set forth below is intended as a description of various embodiments and is of intended as a limitation of the invention. For the purposes of explanation, numerous specific details are set forth in order to provide a thorough understanding of examples of embodiments of the invention. It should be apparent, however, that embodiments of the invention may be practiced without these specific details, or with an equivalent arrangement. Also, in other instances, well-known structures and components are shown in block diagram or schematic form in order to avoid obscuring these structures and components.

Embodiments of the invention are directed to semiconductor structures in which metal trenches are formed between gates. As discussed above, in these structures, insulating spacers separate these metal trenches from the gates. As the gate caps are etched, portions of these insulating spacers may also be etched away. Subsequently, when metal is deposited on the gate, metal may fill some of the space previously filled by the etched away spacer and form an undesired electrical contact or short between the metal trench and the gate.

Figure 1:
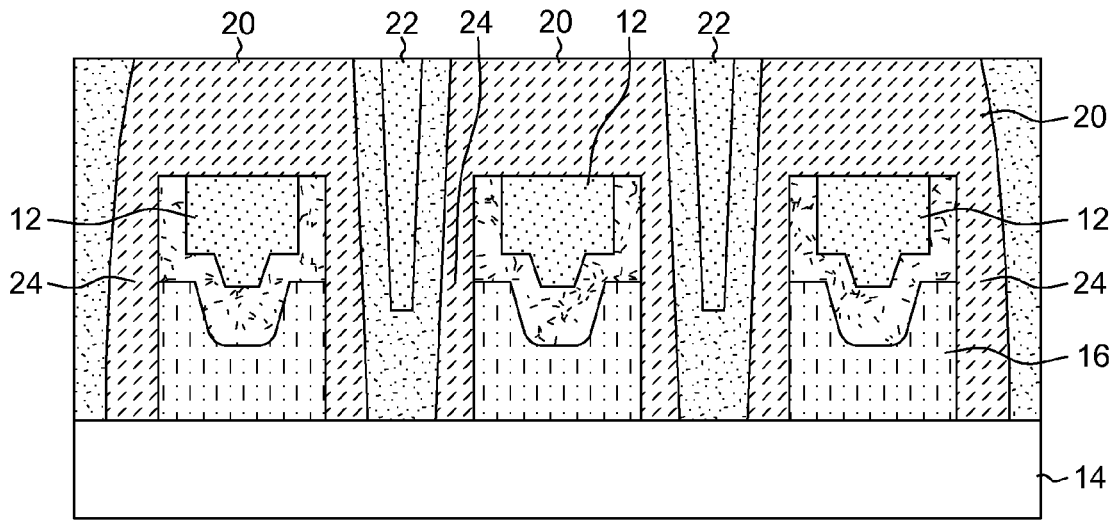
FIG. 1 shows a group of gates in a semiconductor structure with metal trenches between the gates.
Figure 2:
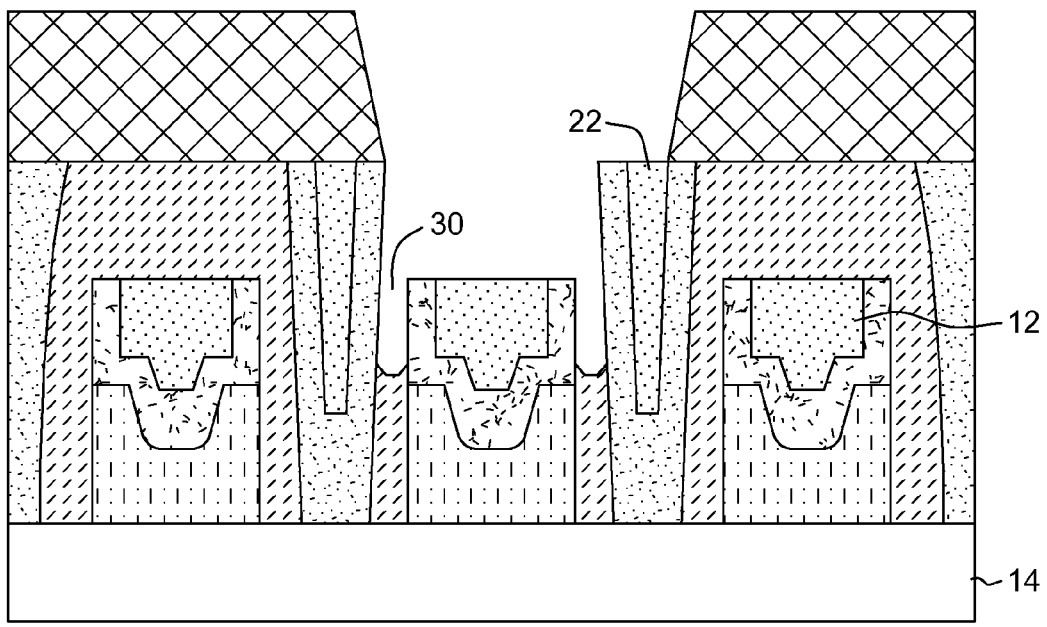
FIG. 2 illustrates the results of an oxide etching process performed on the gates of FIG. 1, and in which parts of the spacer between the middle gate and an adjacent metal trench are removed.
Figure 3:
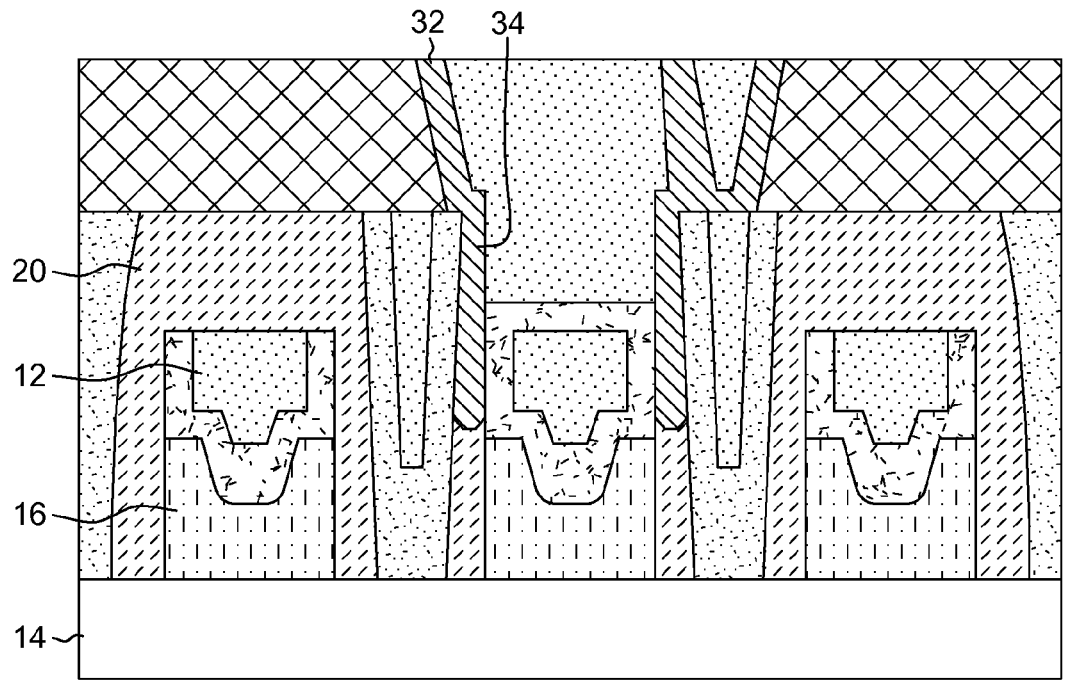
FIG. 3 depicts an electrical short formed between the middle gate and an adjacent metal trench.

FIGS. 1-3 illustrate how such a short develops.

FIG. 1 shows a plurality of gates 12 formed above a substrate 14. A work function metal (WFM) 16 is deposited on the substrate, between each gate and the substrate, and a SiN cap 20 is formed above each gate. Metal trenches 22, referred to as trench silicides, are located between the gates, and spacers 24 separate the trench silicides from the gates.

In the formation of the semiconductor devices, contacts are formed above some of the gates. To form a contact above a gate, the gate cap is etched away and a metal is deposited over the gate.

As illustrated in FIG. 2, when a gate cap is etched away, portions of adjacent spacers may also be etched away, forming an open space 30 between the gate and an adjacent trench silicide. Later, as shown in FIG. 3, when a metal 32 is deposited on the gate, some of this metal is deposited in the space between the trench silicide and the gate, forming an undesired metal connection 34 or bridge between the trench silicide and the gate.

FIGS. 4-11 show a procedure for forming the desired contact above a gate without forming the trench silicide short.

Figure 4:
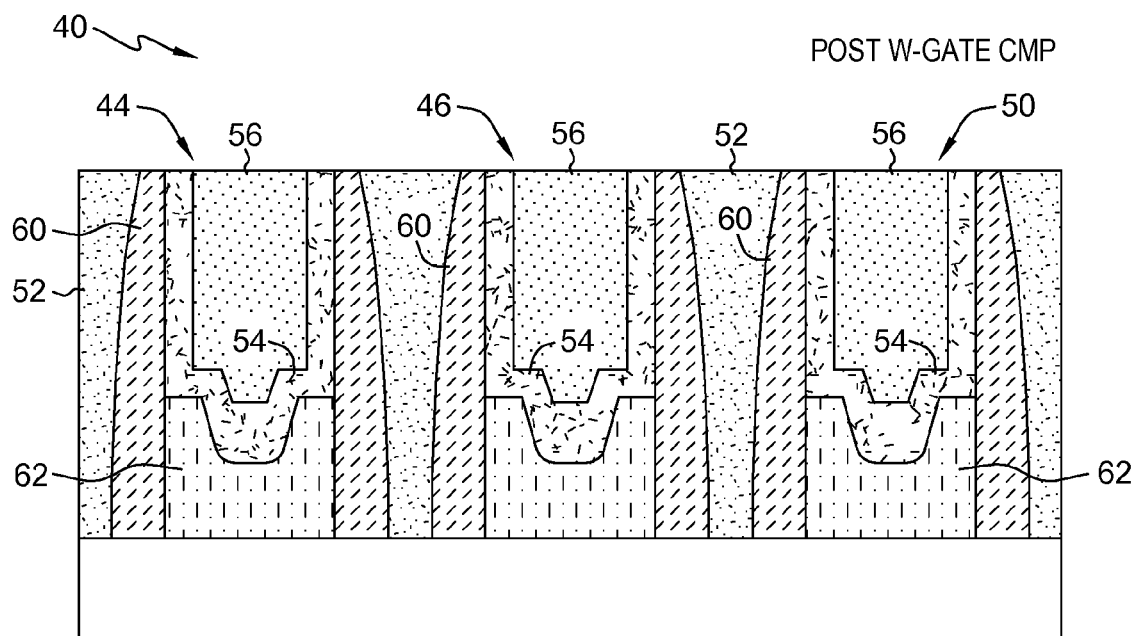
FIG. 4 shows a group of tungsten gates on a semiconductor structure after a chemical mechanical polish.

FIG. 4 shows a portion of a semiconductor structure 40 comprising a substrate 42 and a plurality of gates 44, 46, 50 formed in an interlayer dielectric 52. Each gate includes a gate dielectric 54 and a metal electrode 56, and a spacer 60 extends around each gate. With the embodiment shown in FIG. 4, the metal electrode 56 is tungsten, and FIG. 4 shows the structure after a chemical-mechanical polish has been performed to planarize the top surface of the tungsten. Also, in this structure, a work function metal (WFM) 62 is deposited on the substrate 42, between the substrate and each gate.

Typically substrate 42 is a whole or a portion of a semiconductor wafer formed of any semiconducting material including, for example, Si, Ge, SiGe, SiC, SiGeC, InAs, GaAs, InP or other like III/V compound semiconductors. Substrate 42 can be the buried insulator and a supportive semiconductor layers of an SOI wafer (semiconductor-on-insulator), ETSOI wafer (extremely thin semiconductor-on-insulator), or SiGeOl wafer. Alternatively, substrate 42 can include regions of non-semiconductor material which could be a dielectric material such as silicon dioxide.

Overlying the substrate 42 and substantially surrounding each gate structure 44, 46, 50 is an interlayer dielectric (ILD) 52. The ILD 52 can include one or more conventional dielectric materials such as: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H).

The gate dielectric 54 can be an oxide, nitride, and/or oxynitride. In one example, the gate dielectric 54 can be a high k material having a dielectric constant greater than silicon dioxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$. In some embodiments, the gate dielectric can be a multilayered structure comprising different gate dielectric materials, e.g., silicon dioxide, and a high k dielectric material.

The gate dielectric 54 can be formed by any deposition technique including, for example, chemical vapor deposition (CVD), plasma enhanced chemical vapor deposition (PECVD), physical vapor deposition (PVD), sputtering, or atomic layer deposition (ALD). The gate dielectric often has a thickness in a range from 1 nm to 10 nm, though other thicknesses can be employed.

The electrode 56 can be any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The electrode layer can be formed utilizing conventional deposition such as CVD, PECVD, PVD, ALD, etc., and conventional silicidation if the electrode is a silicide material.

As mentioned above, in the embodiment of FIG. 4, a work function material (WFM) 62 is located between substrate 42 and gate 44, 46, 50. The WFM may be, for example, TiN, and the material may be grown in place, above substrate 42. The WFM improves fill-in of the metal material, which lowers gate resistance in the device.

Figure 5:
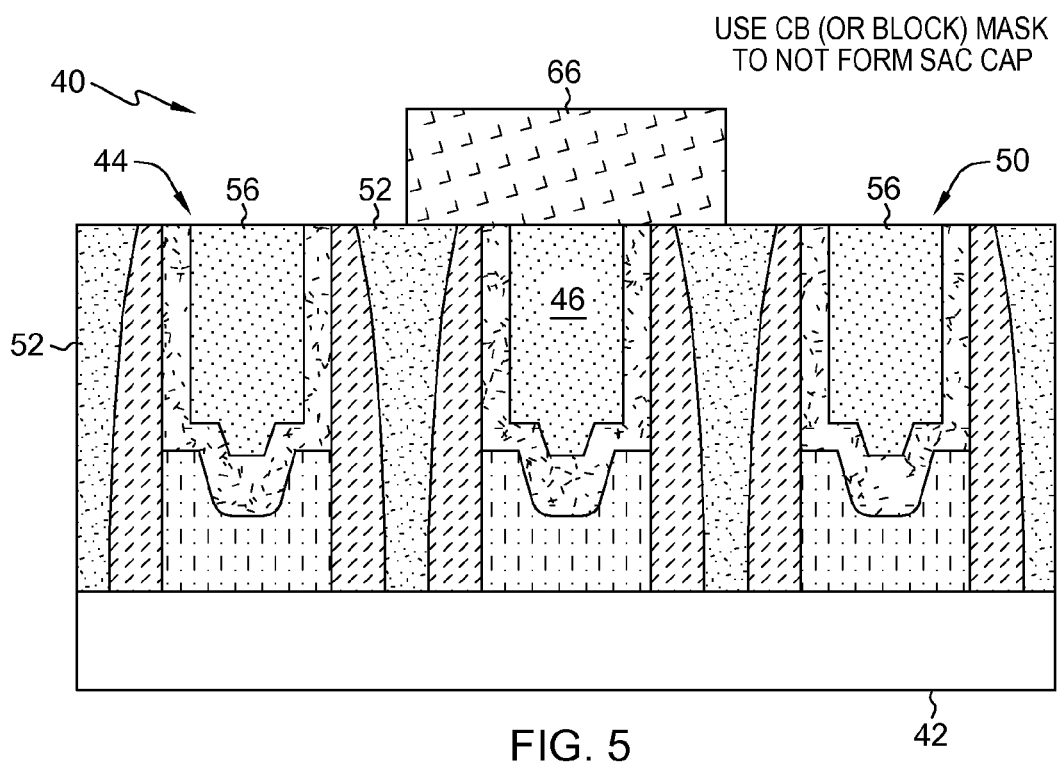
FIG. 5 shows the gates of FIG. 4 with a mask over the middle gate.
Figure 6:
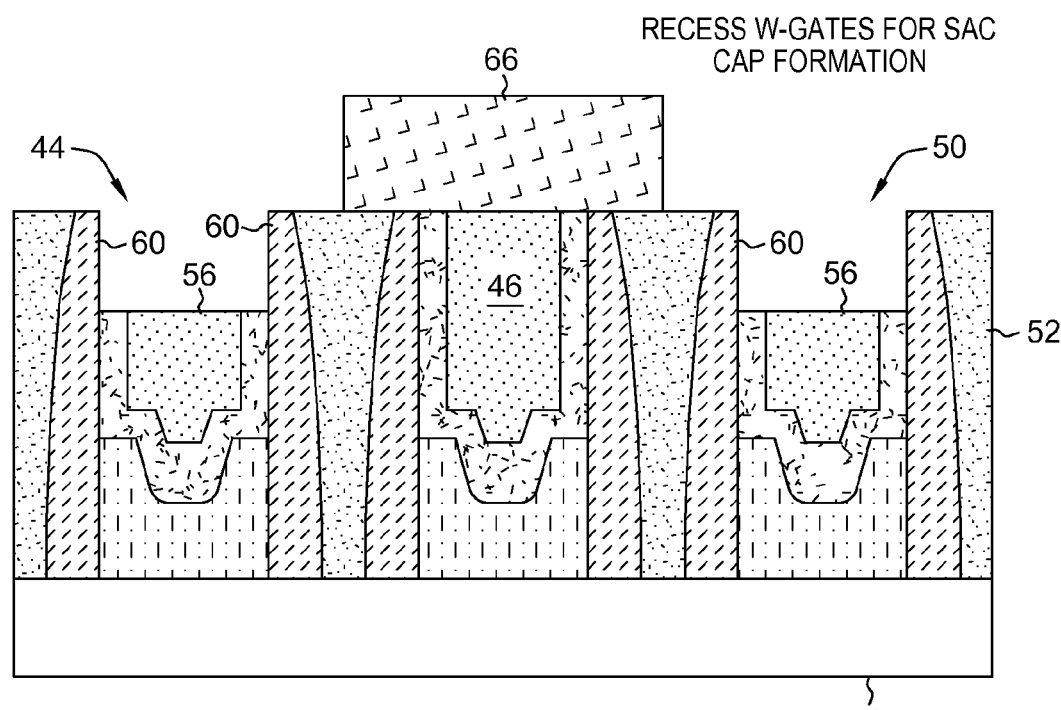
FIG. 6 depicts the gates of FIGS. 4 and 5 after two of the gates have been recessed.
Figure 7:
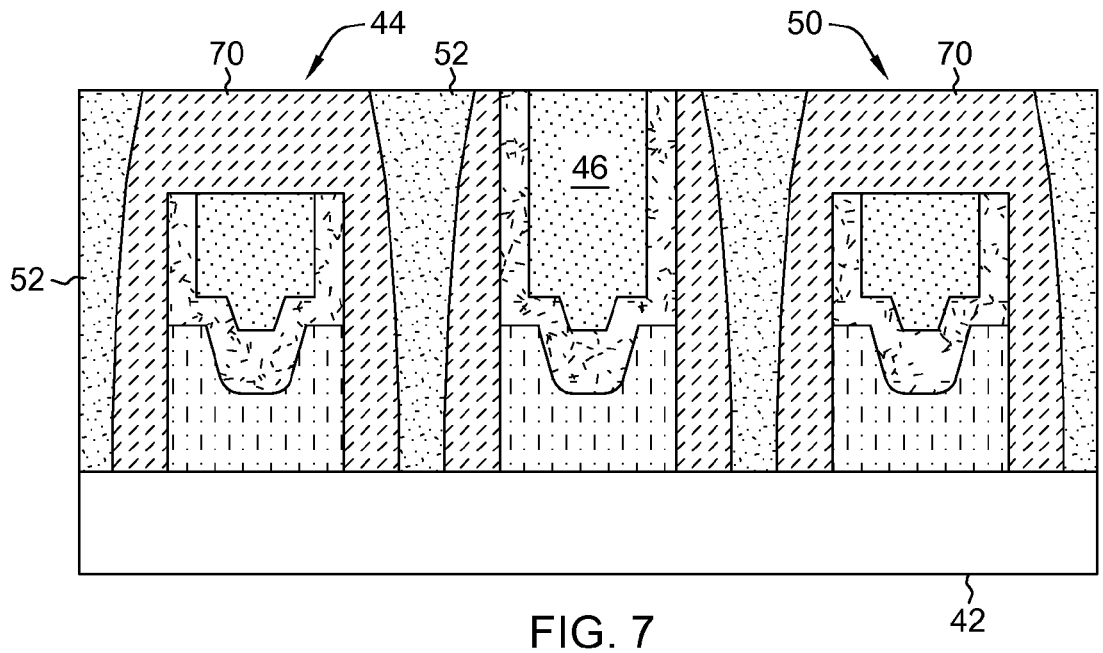
FIG. 7 illustrates the gates of FIG. 6 after SiN caps have been formed on the recessed gates.

In embodiments of the invention, caps are formed over gates 44 and 50, but not over gate 46. FIGS. 5-7 illustrate this. Generally, as shown in FIG. 5, a mask 66 is used to cover gate 46. The upper portions of the tungsten in gates 44 and 50 are removed, as shown in FIG. 6. Mask 66 can then be removed, and, as shown in FIG. 7, caps 70 are formed above tungsten 56 in gates 44 and 50.

Gate cap 70 can be any material used as a hard mask such as silicon oxide, silicon nitride, silicon oxynitride, a dielectric metal oxide, a dielectric metal nitride, a dielectric metal oxynitride, or a combination thereof. In some embodiments, gate cap 70 can be in the range of 25 nm to 100 nm thick. The material choice may be dictated by an objective to mask certain structure, such as the gate electrode, from processing steps on other portions of the structure.

Figure 8:
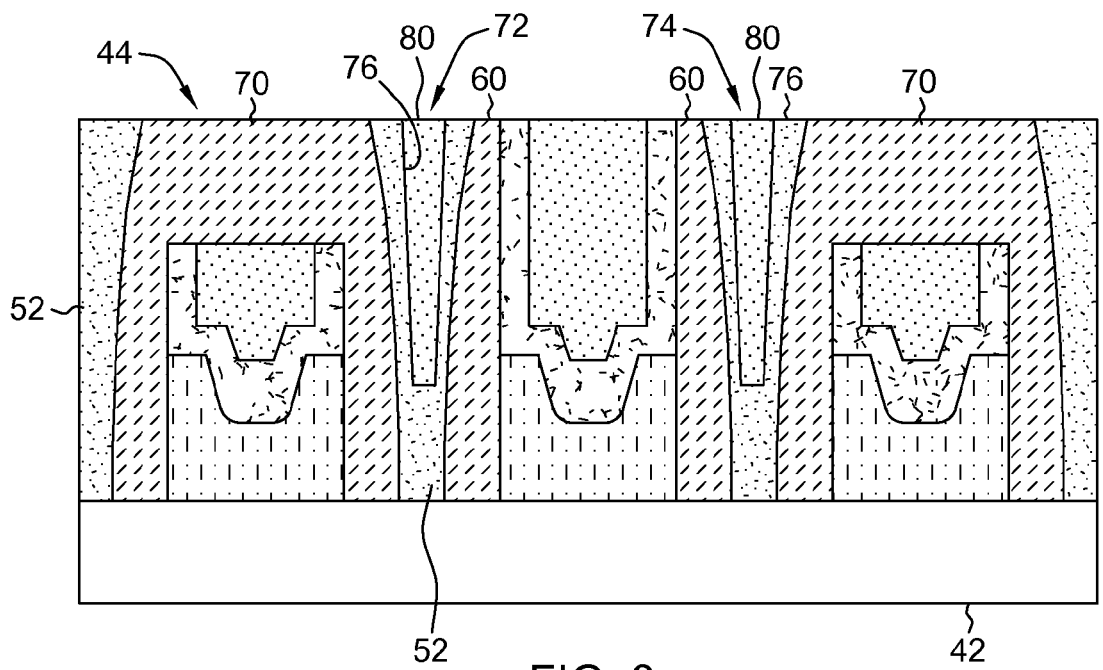
FIG. 8 shows the gates of FIG. 7 after trench-silicides have been formed between the gates.

After the gate caps are formed, trench silicides are formed. With reference to FIG. 8, trenches 72, 74 are formed into dielectric material 52, extending generally parallel to and spaced from gates 44, 46, 50. In this embodiment, trenches 72, 74 are separated from gate 46 not just by gate spacer 60 but also by a thickness of dielectric material 52. Any suitable etching process may be used to form the trenches.

A metal film 76 is formed in trenches 72, 74, and a metal silicide-forming metal 80 is deposited in the trenches. Metal 80 can be, for example, Ni, Pt, Co, and alloys such as NiPt. An optional diffusion barrier layer (not shown) such as, for example, TiN or TaN can be deposited atop the metal silicide-forming metal 80.

Figure 9:
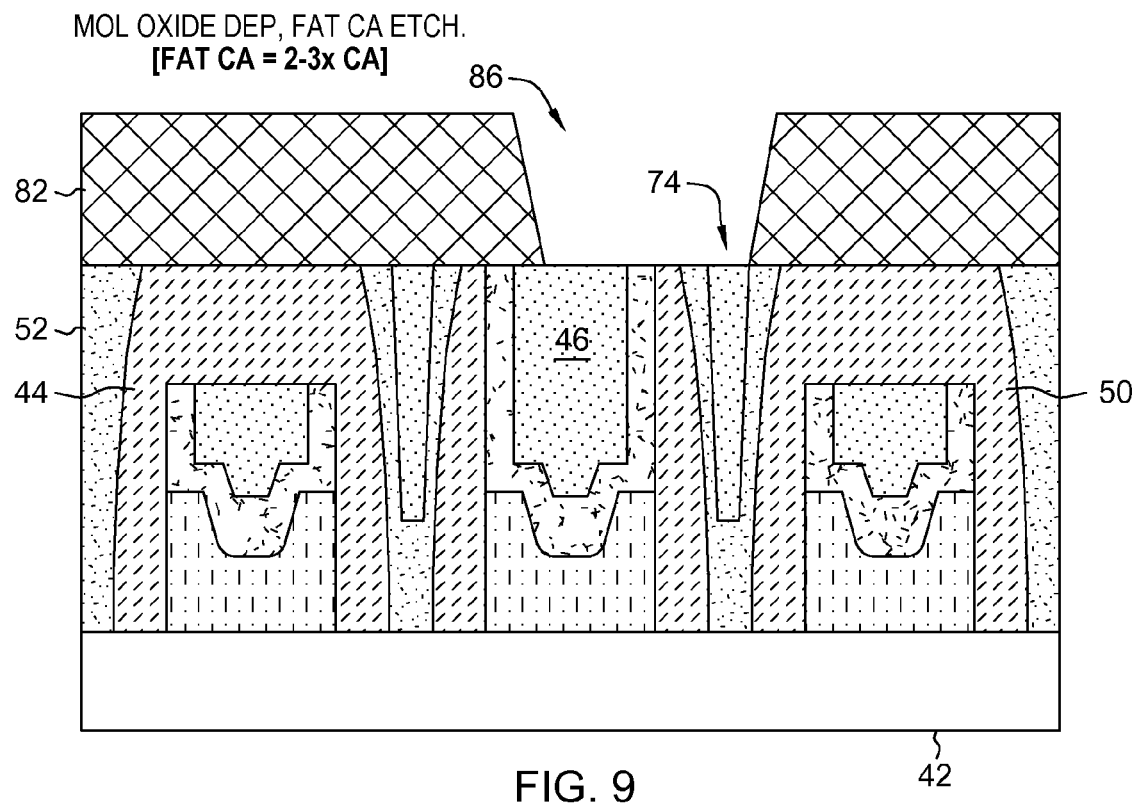
FIG. 9 shows the gates of FIG. 8 after an oxide deposit on the gates.

As shown in FIG. 9, an oxide layer 82 is deposited over gates 44, 46, 50, and a portion of the oxide 82 over gate 46 and trench silicide 74 is etched away, forming open area 86. Any suitable processes may be used to deposit this oxide and to etch away the portion above gate 46 to form area 86.

Figure 10:
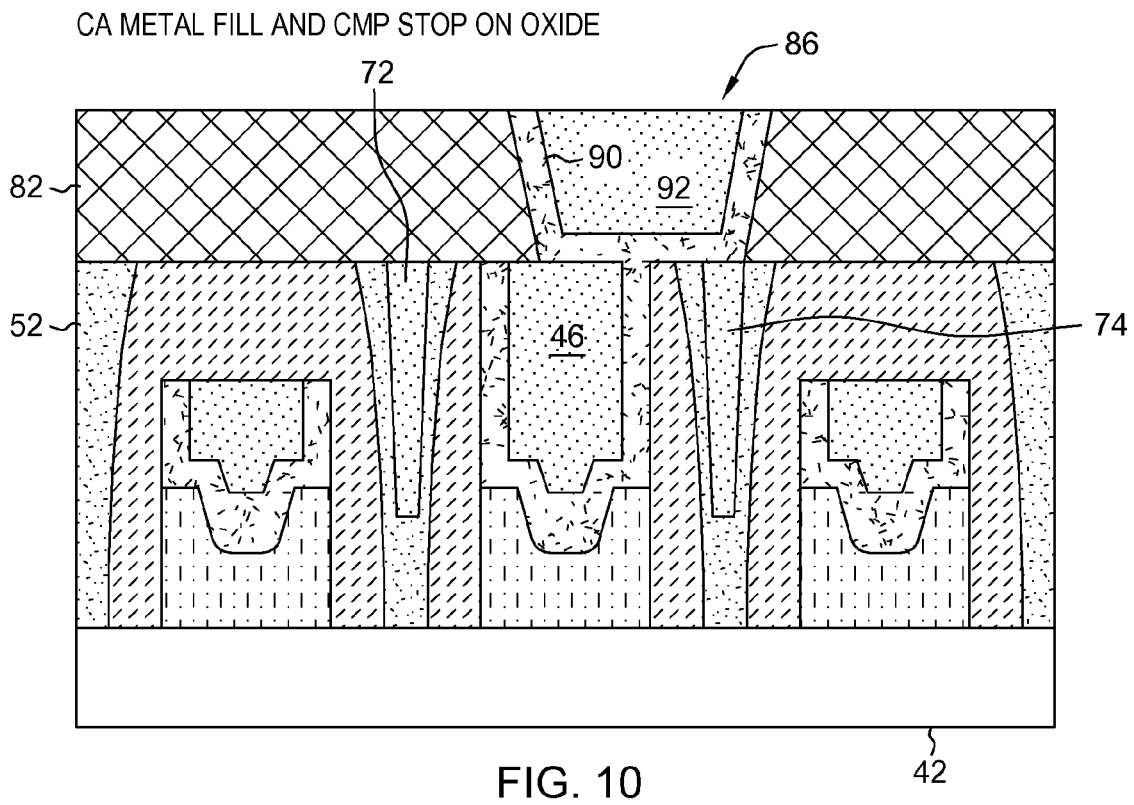
FIG. 10 illustrates the gates of FIG. 9 with a gate contact area formed over the center gate.

With reference to FIG. 10, a metal liner 90, such as TiN, is formed in area 86, and this area is filled with a metal, forming a gate-contact area 92. A CMP that stops on the oxide may be used to planarize the top surface of the metal fill 92.

In this embodiment, contact 92 is in electrical contact with gate 46 and trench silicide 74. At the same time, the gate 46 is electrically separated from trench silicide 72.

Figure 11:
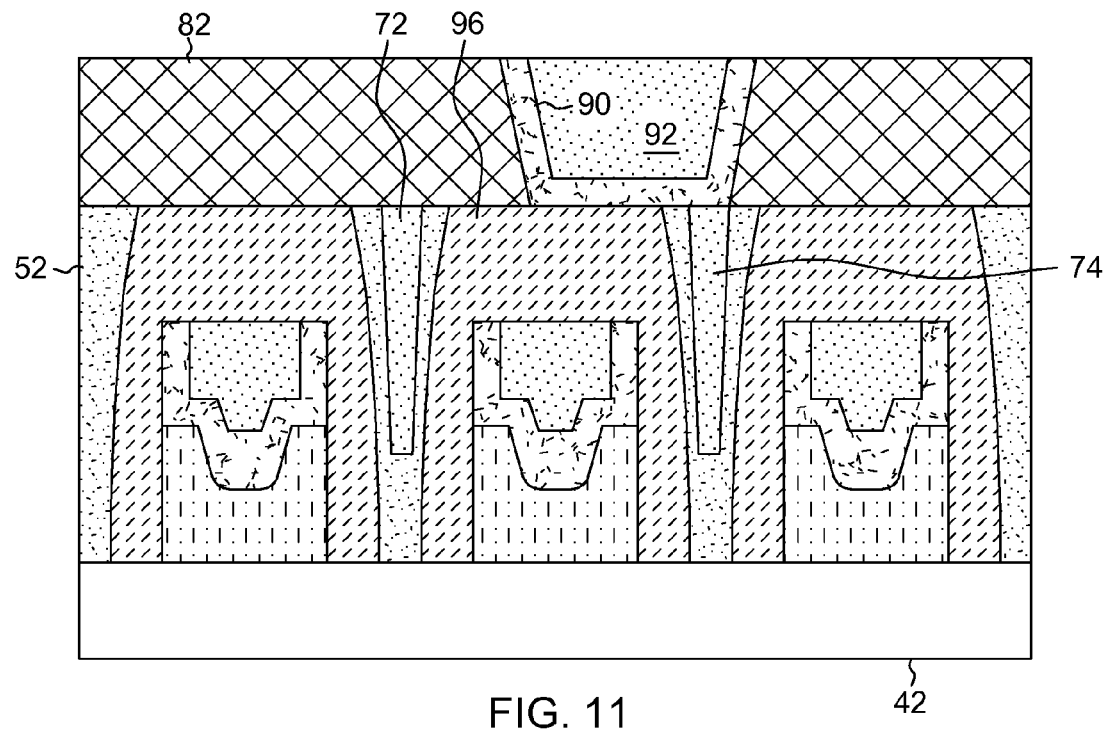
FIG. 11 illustrates an alternate arrangement in which a non-gate contact area is formed over the center gate.

In an alternate arrangement, illustrated in FIG. 11, a non-gate contact area 94 is formed above gate 46. In this arrangement, the tungsten in the gate 46 is etched and a cap 96 is formed over the gate, similar to gates 44 and 50. Oxide liner 82 is formed over the gates 44, 46, 50, and a portion of the oxide liner is etched away and then filled with metal liner 90 and with contact 92.

With the arrangement shown in FIG. 11, contact area 92 is in electrical contact with trench silicide 74 but not with gate 46, and the gate 46 is electrically separated from both trench silicides 72 and 74.

FIGS. 12-21 show an alternate procedure.

Figure 12:
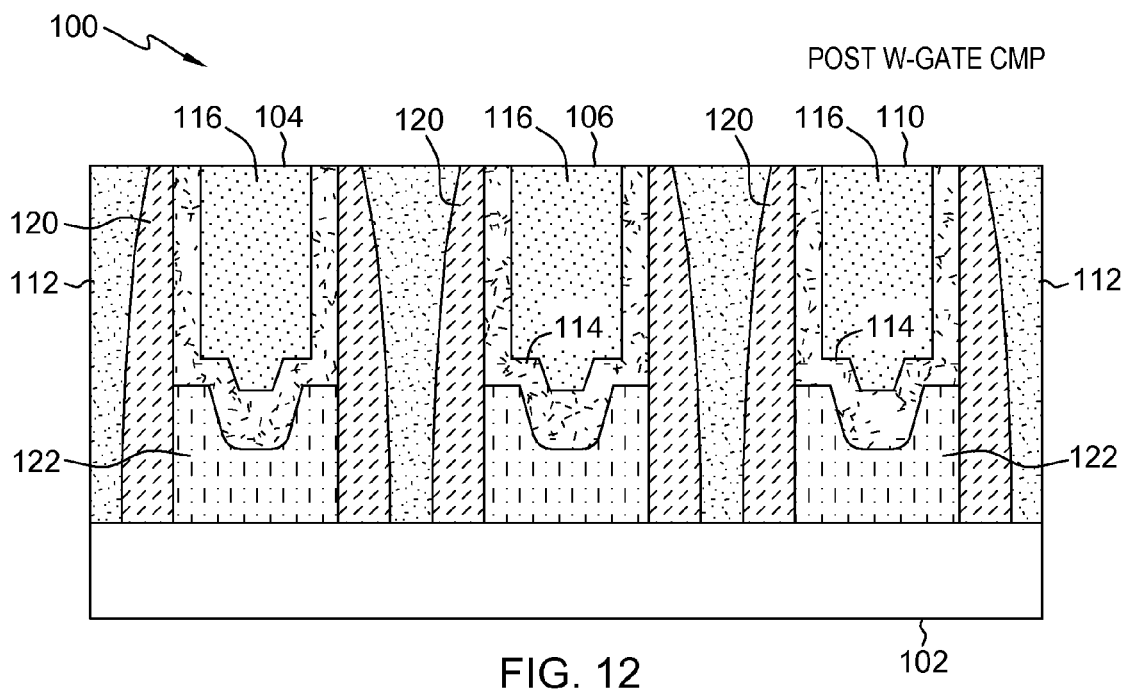
FIG. 12 shows a semiconductor structure comprising a substrate and a plurality of gates formed in an interlayer dielectric.

In embodiments of the invention, the procedure starts with the device shown in FIG. 12. FIG. 12, similar to FIG. 4, shows a semiconductor structure 100 comprising a substrate 102 and a plurality of gates 104, 106, 110 formed in an interlayer dielectric 112. Each gate includes a gate dielectric 114 and a metal electrode 116, and a spacer 120 extends around each gate. With the embodiment shown in FIG. 12, the metal electrode 116 is tungsten, and FIG. 12 shows the structure after a chemical-mechanical polish has been performed to planarize the top surface of the tungsten. A work function metal (WFM) 122 is deposited on the substrate 102, between the substrate and each gate 104, 106, 110.

Figure 13:
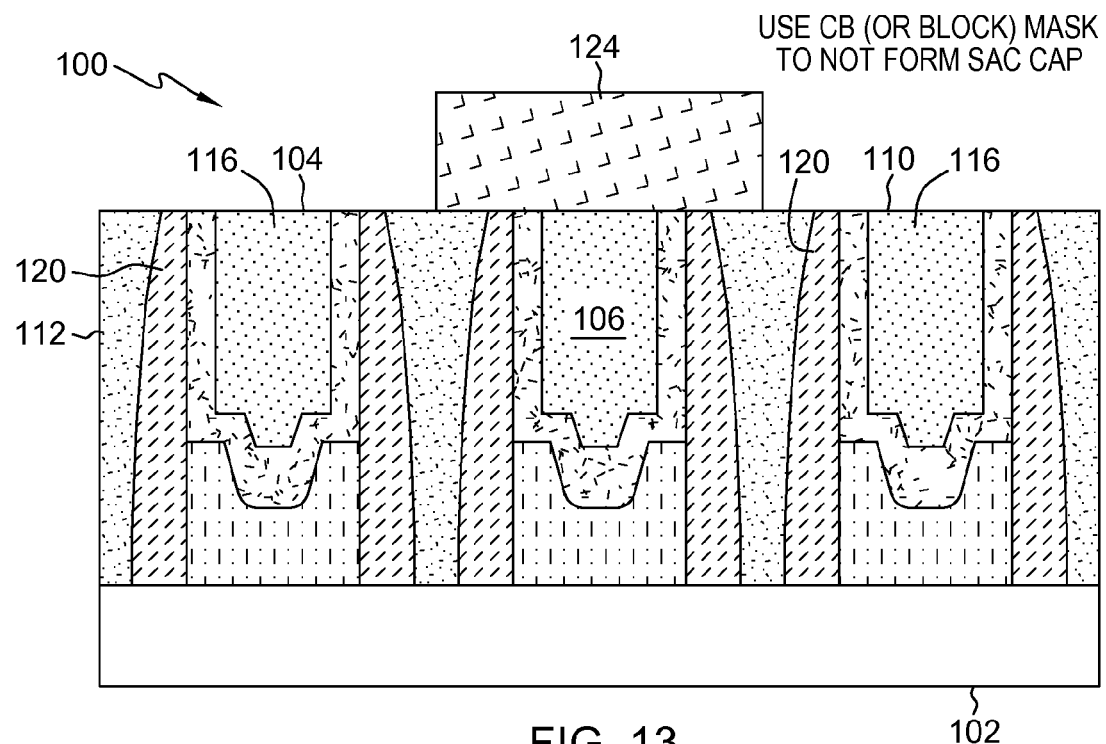
FIG. 13 shows a group of tungsten gates on a semiconductor substrate after a chemical mechanical polish.
Figure 14:
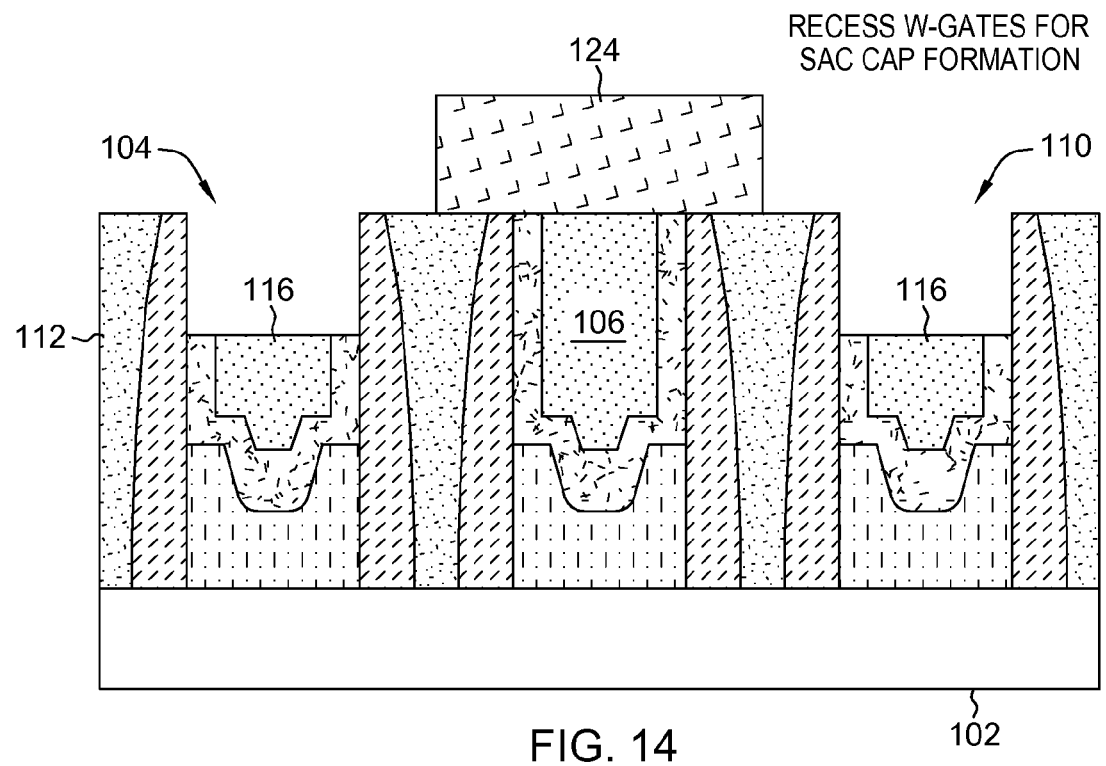
FIG. 14 depicts the gates of FIG. 13 after two of the gates have been recessed.
Figure 15:
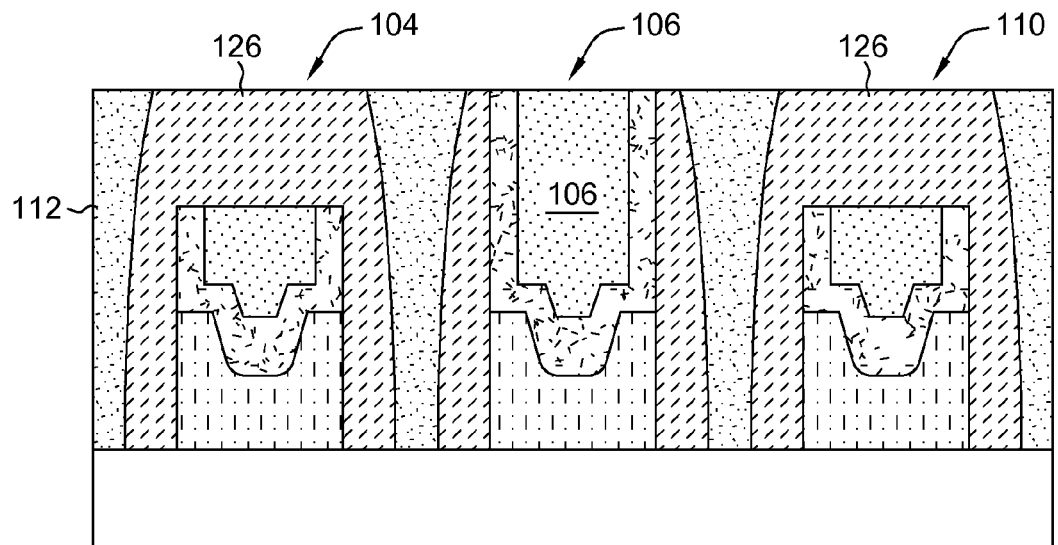
FIG. 15 depicts the gates of FIG. 14 after SiN caps have been formed on the recessed gates.

With reference to FIGS. 13-15, SiN caps are formed on gates 104 and 110. As shown in FIG. 13, a mask 124 is used to cover gate 106. The upper portions of the tungsten 116 in gates 104 and 110 are removed, as shown in FIG. 14. Mask 124 can then be removed and, as shown in FIG. 15, caps 126 are formed above the tungsten in gates 104 and 110.

Gate caps 126 can be any material used as a hard mask such as silicon oxide, silicon nitride, silicon oxynitride, a dielectric metal oxide, a dielectric metal nitride, a dielectric metal oxynitride, or a combination thereof. In some embodiments, gate caps 126 can be in the range of 25 nm to 100 nm thick. The material choice may be dictated by an objective to mask certain structure, such as the gate electrode, from processing steps on other portions of the structure.

Figure 16:
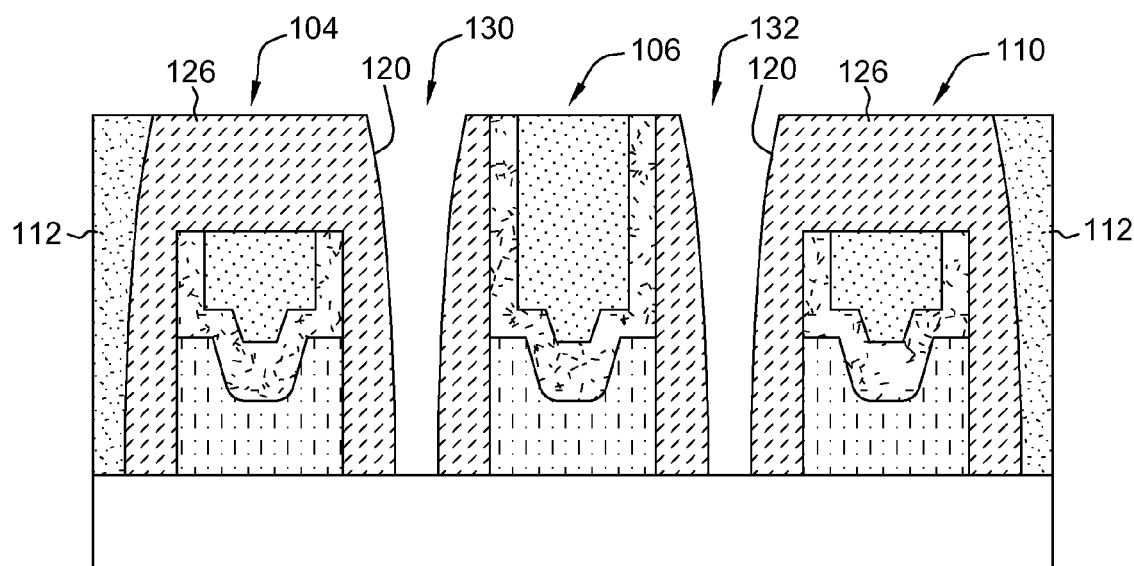
FIG. 16 illustrates the gates of FIG. 15 after trenches have been formed between the gates.

After SiN caps 126 are formed, trench silicides are formed. As shown in FIG. 16, trenches 130 and 132 are formed into dielectric material 112, extending generally parallel to and spaced from gates 104, 106, 110. In this embodiment, trenches 130 and 132 are separated from gates 104, 106, 110 not just by gate spacers 120 but also by a thickness of dielectric material 112. Any suitable etching process may be used to form the trenches 130 and 132.

Figure 17:
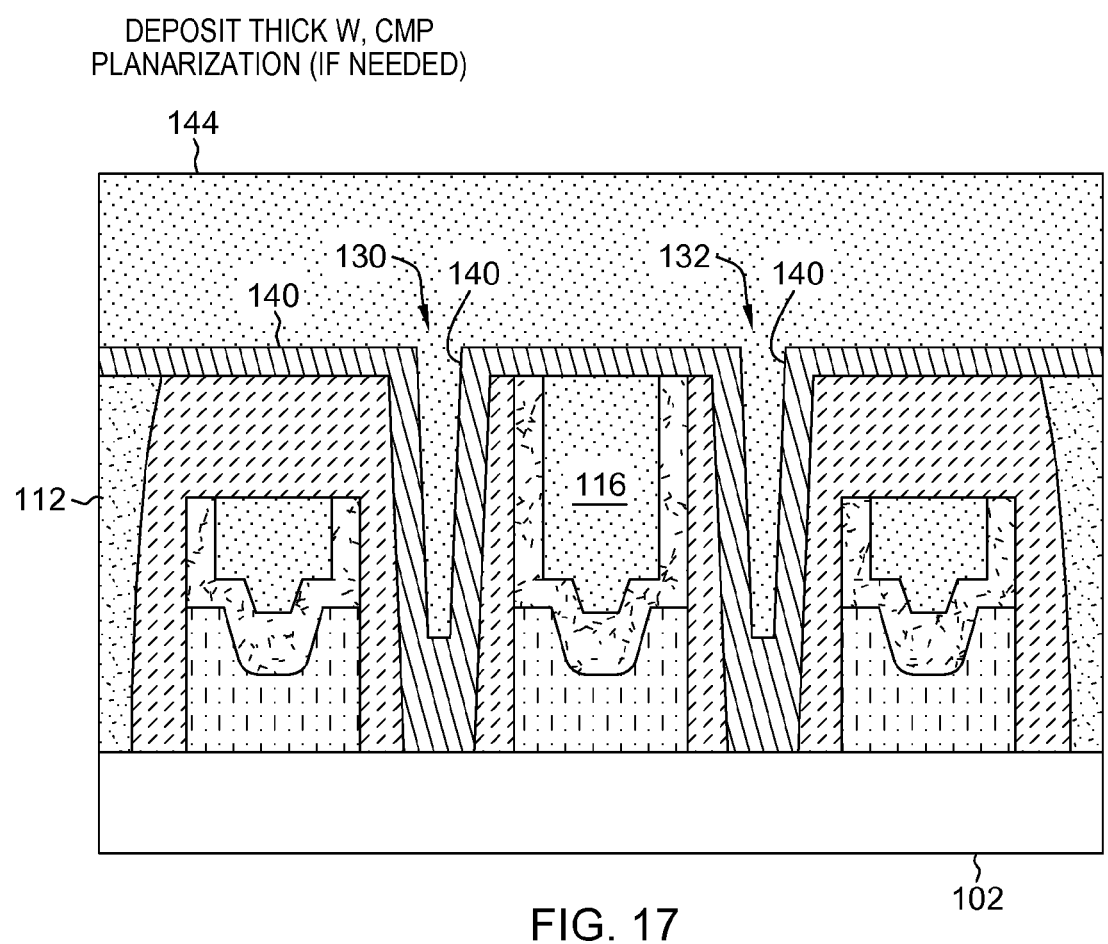
FIG. 17 shows the gates of FIG. 16 after a tungsten deposition on the gates.

With this embodiment, as shown in FIG. 17, after trenches 130 and 132 are formed, a metal layer 140 is deposited in the trenches and also over the tops of gates 104, 106, 110. A thick layer of tungsten 144 is deposited over metal layer 140 and gates 104, 106, 110. Any suitable procedure may be used to deposit the tungsten.

Figure 18:
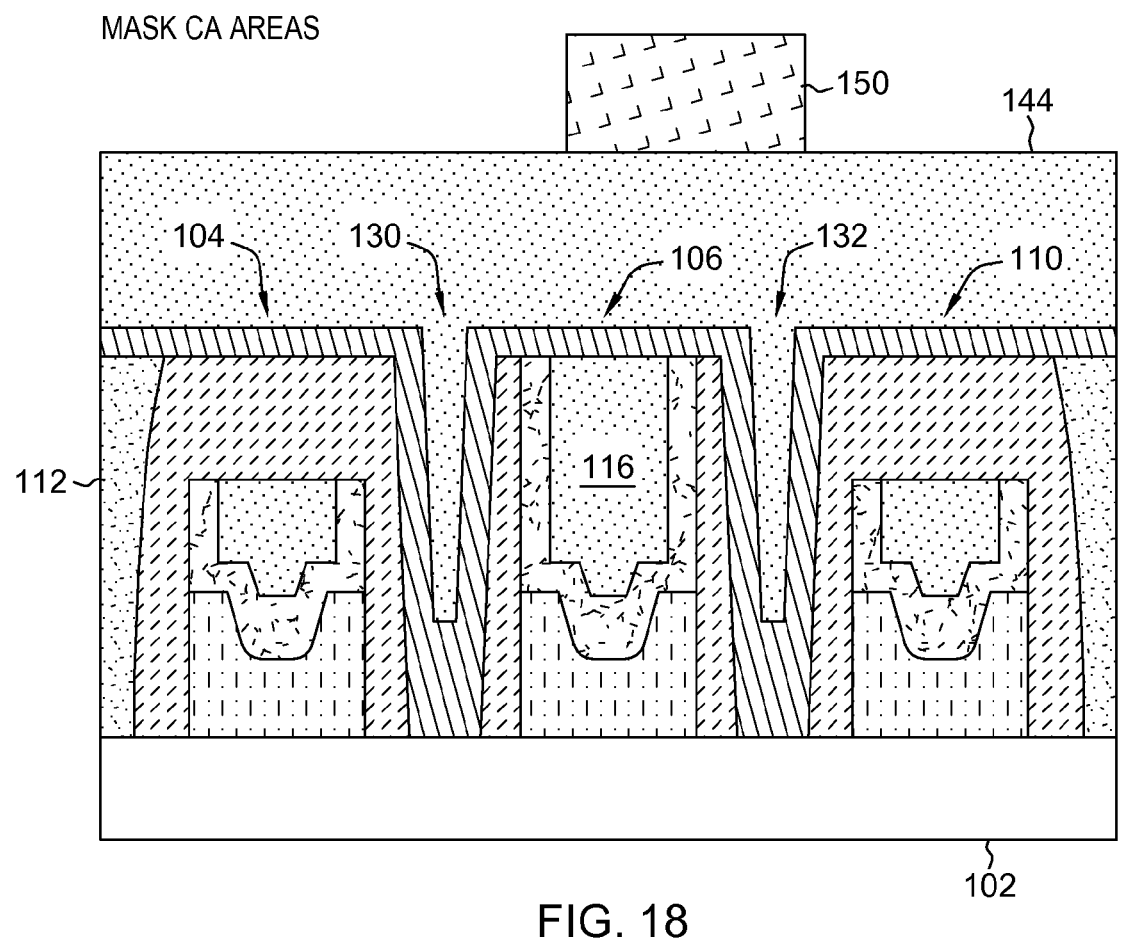
FIG. 18 shows the gates of FIG. 17 with a mask on the tungsten layer.

With reference to FIG. 18, after the thick tungsten deposit, a contact area mask 150 is placed over a portion of the tungsten 144, above trench silicide 132 and extending above most, but not all, of gate 106.

Figure 19:
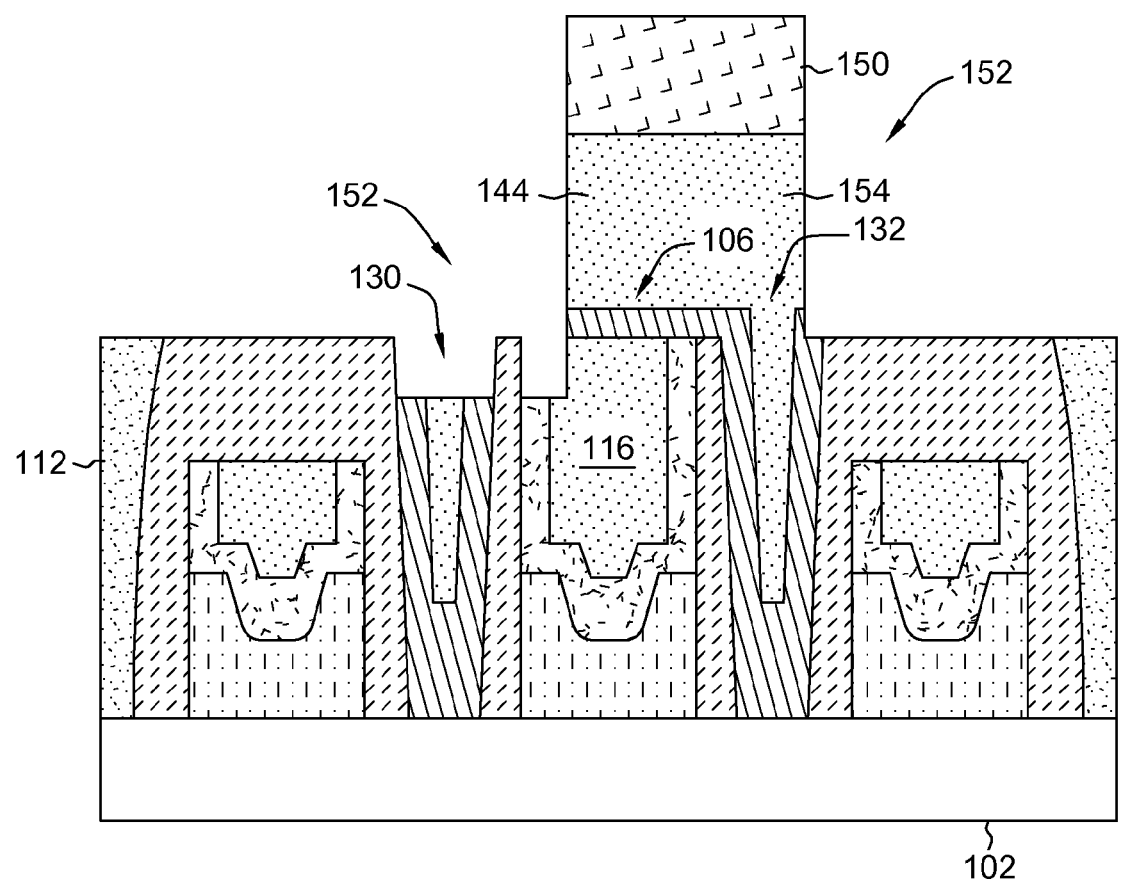
FIG. 19 illustrates the gates of FIG. 18 after portions of the tungsten layer have been removed.

The tungsten not covered by the mask is etched away, as shown in FIG. 19 at 152. In this etching process, the portion of metal layer 140 on top of the gates and not covered by mask 150 is also etched away. In addition, the trench silicide in trench 130 is recessed, and an upper portion of tungsten 116 of gate 106 and a portion of metal layer 140 on this part of gate 106 may also be etched away, as depicted in FIG. 19. This etch leaves a tungsten portion 154 above gate 106 and trench 132. After this etch, mask 150 is removed. Any suitable etch may be used, and for example, a reactive ion etch may be used.

Figure 20:
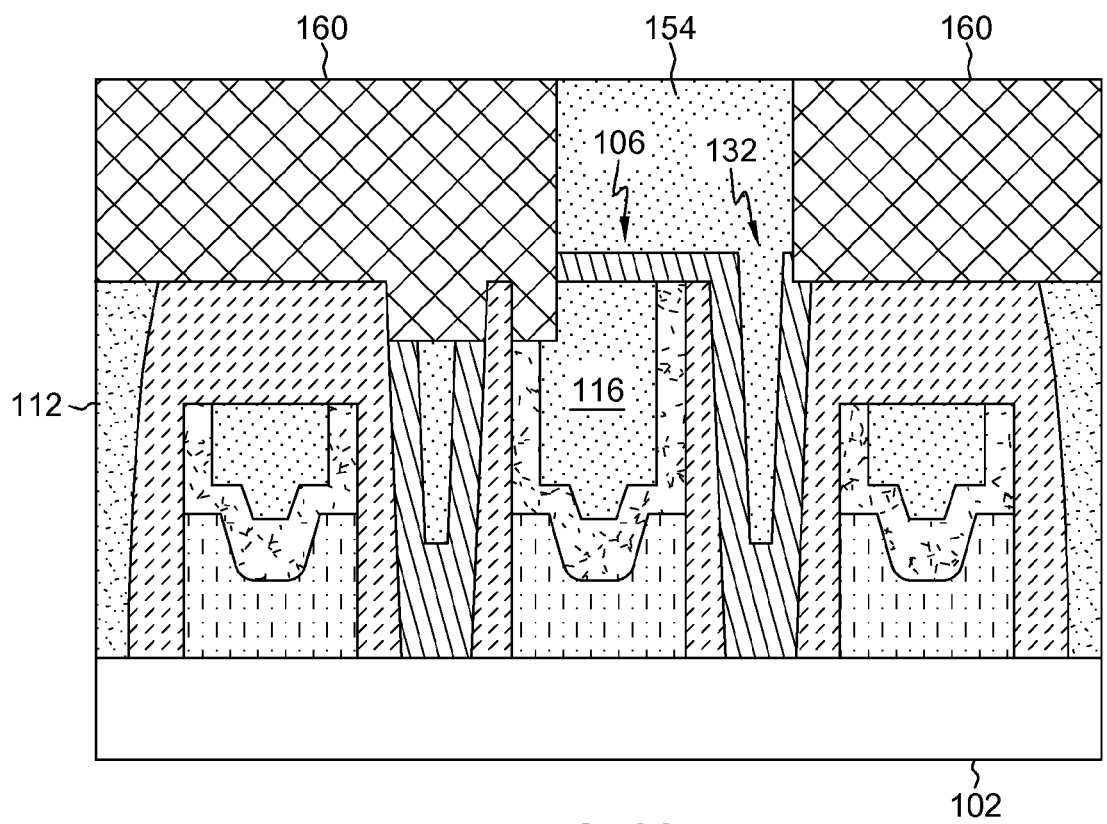
FIG. 20 shows the gates of FIG. 19 with a metal oxide deposited on the SiN caps.

As illustrated in FIG. 20, an oxide 160 is then deposited to the sides of the remaining tungsten portion 154. This tungsten 154 forms a gate contact area above and in electrical contact with gate 106 and trench silicide 132. At the same time, gate 106 is electrically separated from trench silicide 130.

Figure 21:
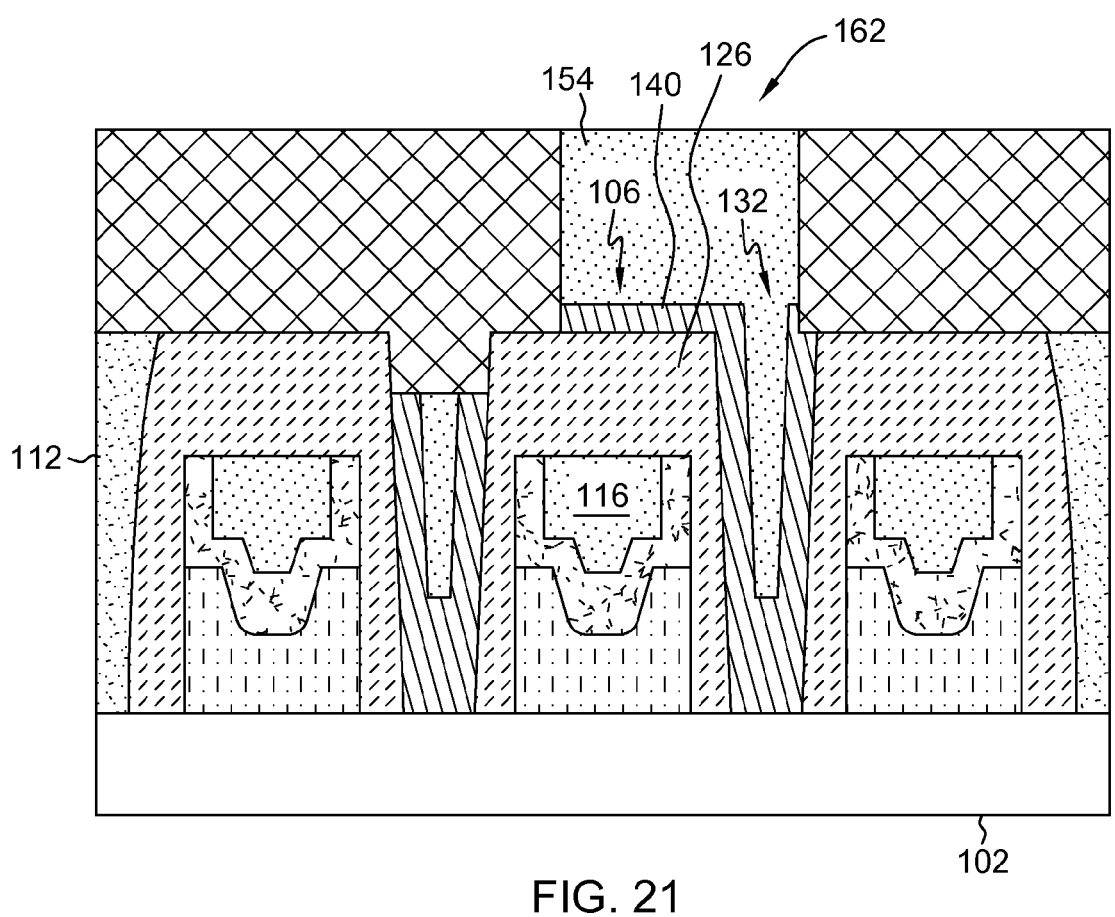
FIG. 21 shows an alternate arrangement where the metal layer over the middle gate is electrically separated from that gate.

FIG. 21 shows an alternate arrangement in which a non-gate contact area 162 is formed over gate 106. With this arrangement, the tungsten 116 in gate 106 is etched, a cap 126 is formed over the gate, and the gate cap is covered by metal layer 140, similar to gates 104 and 110. Also similar to the structure shown in FIG. 18, a tungsten layer is formed to cover gates 104, 106, 110; and this tungsten layer is etched and replaced with oxide, similar to as shown in FIGS. 19 and 20. However, with this procedure, tungsten portion 154 is kept apart from the tungsten 116 of gate 104.

In the resulting arrangement, shown in FIG. 21, non-gate contact area 162 is in contact with trench silicide 132 but not gate 106, and the gate 106 is electrically separated from contact area 162 and both silicide trenches 130 and 132.

Embodiments of the invention provide gate and non-gate contacts that selectively connect the device gates to silicide trenches while maintaining the desired trench silicide metal-to-spacer structure intact and thereby avoid trench silicide shorts. Also, the process flows are simple and, for example, do not require any SiN etch to contact gate conductor, and the process flows are extendible to future technology nodes.

The description of the invention has been presented for purposes of illustration and description, and is not intended to be exhaustive or to limit the invention in the form disclosed. Many modifications and variations will be apparent to those of ordinary skill in the art without departing from the scope of the invention. The embodiments disclosed are described in order to explain principles and applications of the invention, and to enable others of ordinary skill in the art to understand the invention. The invention may be implemented in various embodiments with various modifications as are suited to a particular use.

The invention claimed is:

1. A method of fabricating a semiconductor structure comprising a semiconductor substrate, a dielectric layer on the substrate, and a plurality of gates located within the dielectric layer, above the substrate, the plurality of gates including a first gate and a pair of adjacent gates on sides of the first gate, and each of the gates including a gate electrode, the method comprising:
    forming gate caps on the pair of adjacent gates, including etching portions of the gate electrodes in said adjacent gates to recess the gate electrodes therein, and forming the caps on said adjacent gates above the recessed gate electrodes;
    masking the first gate during the etching;
    after forming the gate caps on the pair of adjacent gates, forming conductive metal trenches in the dielectric layer and on the sides of the first gate, between the first gate and the adjacent gates, each of the metal trenches being spaced from and electrically separated from the first gate; and
    after forming the conductive metal trenches, forming a contact over and directly on a top of the gate electrode of the first gate and laterally extending from the top of the gate electrode of the first gate, to and directly on a top of one of the conductive metal trenches to connect electrically the first gate and said one of the conductive metal trenches.

2. The method according to claim 1, wherein the forming the contact includes:
    depositing a metal material over and into contact with the first gate and said one of the metal trenches to form the contact in electrical contact with the first gate and said one of the metal trenches while keeping the gate electrically separated from a second of the conductive metal trenches.

3. The method according to claim 2, wherein:
    the forming the contact further includes forming an insulating layer over the series of gates and the conductive metal trenches, and removing a portion of the insulating layer to form an open area over and extending to the gate electrode of the first gate and the one of the conductive metal trenches; and the depositing a metal material includes depositing a metal fill in said open area to form the contact.

4. The method according to claim 3, wherein:

the removing a portion of the insulating layer includes maintaining the insulating layer over the second of the conductive metal trenches; and the depositing a metal fill includes using the insulating layer to keep the metal fill separated from the second of the conductive metal trenches to keep the first gate electrically separated from the second of the conductive metal trenches.

5. The method according to claim 1, wherein the forming the contact includes:

depositing a conductive material above and on the first gate and the conductive metal trenches; and etching away a portion of the conductive material from a second of the conductive metal trenches to form the contact in electrical contact with the first gate and said one of the metal trenches while keeping the first gate electrically separated from the second of the conductive metal trenches.

6. The method according to claim 1, wherein:

the contact is a gate-contact;

the semiconductor structure defines a top plane;

the dielectric layer and the plurality of gates extend downward from said top plane;

the etching portions of the gate electrodes in the adjacent gates includes etching the gate electrodes in the adjacent gates inward from said top plane; and the forming conductive metal trenches in the dielectric layer includes:

forming the conductive metal trenches after the caps are formed on the adjacent gates, and forming the conductive metal trenches inward from said top plane.

7. A method of fabricating a semiconductor structure comprising a semiconductor substrate, a dielectric layer on the substrate, and a plurality of gates located within the dielectric layer, above the substrate, the plurality of gates including a first gate and a pair of adjacent gates on sides of the first gate, and each of the gates including a gate electrode, the method comprising:

forming gate caps on the pair of adjacent gates;

after forming the gate caps, forming conductive metal trenches in the dielectric layer and on the sides of the first gate, between the first gate and the adjacent gates, each of the metal trenches being spaced from and electrically separated from the first gate;

after forming the conductive metal trenches, forming a contact over and directly on a top of the gate electrode of the first gate and laterally extending from the top of the gate electrode of the first gate, to and directly on a top of one of the conductive trenches to connect the contact electrically with said one of the conductive metal trenches.

8. The method according to claim 7, wherein the forming the contact includes:

depositing a metal material over the first gate and over and onto said one of the metal trenches to form the contact in electrical contact with said one of the metal trenches while keeping the first gate electrically separated from a second of the conductive metal trenches.

9. The method according to claim 8, wherein:

the forming the contact further includes forming an insulating layer over the plurality of gates and the conductive metal trenches, and removing a portion of the insulating layer to form an open area over the gate electrode of the first gate and over and extending to the one of the conductive metal trenches; and the depositing a metal material includes depositing a metal fill in said open area to form the contact.

10. The method according to claim 8, wherein the depositing the metal fill includes maintaining the metal fill separated from the gate electrode of the first gate to keep the first gate electrically separated from the contact and the one of the conductive metal trenches.

11. The method according to claim 7, wherein the forming a contact includes:

depositing a conductive material above the first gate and above and on the conductive metal trenches; and etching away a portion of the conductive material from a second of the conductive metal trenches to form the contact in electrical contact with said one of the metal trenches while keeping the first gate electrically separated from the conductive metal trenches.

12. The method according to claim 11, wherein:

the contact is a non-gate contact; and the forming a contact further includes forming an insulating layer over said second of the conductive metal trenches to keep the contact and said one of the conductive metal trenches electrically separated from said second of the conductive metal trenches.

13. A method of fabricating a semiconductor structure comprising a semiconductor substrate, a dielectric layer on the substrate, and a plurality of gates located within the dielectric layer, above the substrate, the plurality of gates including a first gate and a pair of adjacent gates on sides of the first gate, and each of the gates including a gate electrode, the method comprising:

recessing the gate electrodes of the pair of adjacent gates;

forming gate caps on the pair of adjacent gates;

after forming the gate caps on the pair of adjacent gates, forming conductive metal trenches on the sides of the first gate, between the first gate and the adjacent gates, each of the metal trenches being spaced from and electrically separated from the first gate; and after forming the conductive metal trenches, forming a contact over and directly on a top of the gate electrode of the first gate and laterally extending from the top of the gate electrode of the first gate, to and directly on a top of, and in electrical contact with one of the conductive metal trenches to connect electrically the contact and said one of the conductive metal trenches.

14. The method according to claim 13, wherein:

the contact is a gate contact; and the forming a contact includes:

forming an insulating layer over the plurality of gates and the conductive metal trenches;

removing a portion of the insulating layer to form an open area over and extending to the gate electrode of the first gate and said one of the conductive metal trenches; and depositing a metal material in said open area to form the gate contact electrically connecting the first gate and said one of the conductive metal trenches while keeping the first gate electrically separated from a second of the conductive metal trenches.

15. The method according to claim 14, wherein the forming the contact further includes forming an insulating layer over the series of gates and the conductive metal trenches, and removing a portion of the insulating layer to form an open area over and extending to the gate electrode of the first gate and the one of the conductive metal trenches; and the depositing a metal material includes depositing a metal fill in said open area to form the contact.

16. The method according to claim 13, wherein:
the gate is a non-gate contact; and
the forming the contact includes:
depositing a conductive material above the first gate and above and on the conductive metal trenches; and
etching away a portion of the conductive material from a second of the conductive metal trenches to form the contact in electrical contact with said one of the metal trenches while keeping the first gate electrically separated from the conductive metal trenches.

17. The method according to claim 16, wherein the forming gate caps includes forming a gate cap on the first gate to keep the first gate separated from the contact and the conductive metal trenches.

* * * * *